United States Patent
Brownlow et al.

(10) Patent No.: US 6,556,162 B2
(45) Date of Patent: Apr. 29, 2003

(54) DIGITAL-TO-ANALOG CONVERTER AND ACTIVE MATRIX LIQUID CRYSTAL DISPLAY

(75) Inventors: Michael James Brownlow, Oxford (GB); Graham Andrew Cairns, Oxford (GB); Catherine Rosinda Marie Armida Dachs, Oxon (GB); Hidehiko Yamashita, Yamatokoriyama (JP); Yasushi Kubota, Sakurai (JP); Hajime Washio, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/847,661

(22) Filed: May 2, 2001

(65) Prior Publication Data

US 2002/0041245 A1 Apr. 11, 2002

(30) Foreign Application Priority Data

May 9, 2000 (GB) .............................. 0011015

(51) Int. Cl.[7] .............................. H03M 1/66
(52) U.S. Cl. ...................... 341/145; 341/150
(58) Field of Search ................. 341/118, 120, 341/150, 141, 133, 145, 159; 345/98

(56) References Cited

U.S. PATENT DOCUMENTS

| | | | | |
|---|---|---|---|---|
| 5,051,620 A | * | 9/1991 | Burgin | 326/97 |
| 5,059,979 A | * | 10/1991 | Micic et al. | 341/152 |
| 5,332,997 A | * | 7/1994 | Dingwall et al. | 341/150 |
| 5,511,222 A | * | 4/1996 | Shiba et al. | 341/150 |
| 6,346,908 B1 | * | 2/2002 | Jones, III | 341/172 |

* cited by examiner

*Primary Examiner*—Patrick Wambley
(74) *Attorney, Agent, or Firm*—Renner, Otto, Boisselle & Sklar

(57) ABSTRACT

A digital-to-analog converter includes a first converter stage 1 for converting the m most significant bits of a k bit input signal to upper and lower voltage limits VL and VH by selecting the appropriate low impedance reference voltages. A second converter stage 2 performs a linear conversion of the n least significant bits of the k bit input within the voltage range defined by the voltage limits VL and VH. A precharging circuit including switches SW1 and SW2 disconnects the stage 2 from the load $C_{LOAD}$, which is charged to the voltage limit VL during the precharge phase. The load is subsequently disconnected from the voltage limit VL and connected to the output of the stage 2 to complete charging of the load $C_{LOAD}$ to the converter output voltage.

20 Claims, 10 Drawing Sheets

DIGITAL-TO-ANALOG CONVERTER AND ACTIVE MATRIX LIQUID CRYSTAL DISPLAY

BACKGROUND OF THE INVENTION

1. Field of the Invention

The present invention relates to a digital-to-analog converter (DAC) and to an active matrix liquid crystal display (AMLCD) incorporating such a DAC.

2. Description of the Related Art

A known type of DAC comprises two cascaded stages in which the first stage selects a pair of low-impedance reference voltages from a plurality of voltage references and supplies these as inputs to a second stage linear DAC. DACs of this type are, for example, used in data driver control circuits of AMLCDs with digital interfaces Such converters are used to generate the analog picture element (pixel) voltages and to provide compensation for the non-linear relationship between pixel voltage and pixel light transmission of a liquid crystal pixel. This is generally referred to as gamma correction and is used effectively to linearise the relationship between pixel voltage and pixel transmission.

FIG. 1 of the accompanying drawings illustrates a known type of two stage DAC, for example as disclosed in U.S. Pat. No. 5,877,717. The first stage 1 has $2^m+1$ inputs which are connected to low-impedance reference voltage sources for providing a zero reference voltage and $2^m$ different reference voltages representing the end points of linear segments of a linear segment approximation to a function for providing gamma correction. The first stage 1 functions as a DAC and receives the m most significant bits (MSBs) of a k bit parallel input signal. An m-to-$2^m$ decoder converts the m MSBs so as to supply an active signal on the corresponding one of the $2^m$ outputs and these are used to control two $2^m$-to-1 multiplexers. The m MSBs thus select reference voltages VH and VL corresponding to one of the line segments.

The second stage 2 comprises a linear DAC which is addressed by the n least significant bits (LSBs) of the k bits of the input signal and performs an n-bit linear conversion in the voltage range defined by the upper and lower voltage limits VH and VL. The DAC 2 comprises an n-to-$2^n$ decoder 2a whose outputs control n switches such as 3 for selecting the tapping points of a resistive potential divider comprising resistors such as 4 connected in series between the DAC inputs receiving the voltages VH and VL The output of the DAC 2 is connected, either directly or via an optional buffer 5 shown in broken lines in FIG. 1, to a load, which is illustrated as a capacitive load $C_{LOAD}$.

FIG. 2 of the accompanying drawings illustrates another known two stage converter of the type disclosed in EP 0 899 884. This DAC differs from the one shown in FIG. 1 in that the second stage 2 uses a capacitive converter instead of a resistive ladder converter. The n LSBs directly control n electronic switches such as 6 which selective connect the first electrodes of respective capacitors such as 7 to receive the upper voltage VH or the lower voltage VL from the first stage DAC 1. The second electrodes of the capacitors are connected together and, directly or via the optional buffer 5, to the output of the DAC. Further switches such as 8 are connected across the capacitors and a switch 9 is connected between the second electrodes of the capacitors 7 and the input receiving the lower voltage VL.

The capacitors 7 have binary scaled capacitances such that the capacitance of each capacitor is twice that of the capacitor representing the next least significant bit. The switches 6, 8 and 9 are controlled by a two-phase non-overlapping clock having phases indicated in FIG. 2 as Φ1 and Φ2. During the first phase Φ1. the switches 8 and 9 are closed so as to discharge the capacitors 7 and charge the output of the converter 2 to the lower voltage VL. During the second clock phase Φ2, each capacitor 7 is connected to receive the higher voltage VH if its control bit is high or to the lower voltage VL if its control bit is low.

Two of the important specifications of a DAC are the precision with which the input digital data are converted to the corresponding analog value and the speed of conversion (into a given load impedance). The use of the buffer 5 is advantageous in increasing the drive capability and thus the overall speed of conversion. However, for high speed converters driving high capacitance loads, for example in AMLCDs, this may place a high slew-rate and accuracy requirement on the buffer.

In order to increase the speed of the conversion process, it is known to perform a precharge of the output load to an intermediate level, for example as disclosed in U.S. Pat. No. 5,426,447. Such an arrangement is illustrated in FIG. 3 of the accompanying drawings, which shows an AMLCD including a thin film transistor (TFT) array 10. The array 10 comprises thin film transistors such as 11 which form a matrix array for controlling individual liquid crystal pixels such as 12. The gates of the transistors 11 of each row are connected together and to a scan driver 13 whereas the drains of the transistors 11 of each column are connected together and to respective output buffers 5. Digital data and control signals are supplied to a column data driver 14 including DACs of the type shown in FIG. 1 or FIG. 2 of the accompanying drawings.

The data lines are also connected to a precharging circuit 15 which receives a precharge control signal. The purpose of this arrangement is to reduce the slew-rate requirement on the output buffers 5.

In order to maintain DC balance of the liquid crystal, it is usual to drive the pixels with alternating polarity voltages. For example, the polarity may be reversed after each line or frame of data has been supplied to the display. Thus, the maximum slew-rate capability of the output buffers 5 limits the refresh rate of the display because the required pixel voltage during a refresh cycle has to be achieved from the opposite polarity pixel voltage during the previous refresh cycle.

In the arrangement shown in FIG. 3, before the start of each refresh cycle, the precharge circuit 15 precharges all of the data lines to a fixed voltage so as to reduce the voltage change which must be achieved across each pixel. This reduces the maximum slew-rate required of the output buffers 5.

Techniques of this type are disclosed in EP 0 899 714, EP 0 899 713 and EP 0 899 712. In this case, the precharge circuit 15 precharges the datalines to approximately half of the maximum pixel voltage. Thus, in the worst case where a maximum pixel voltage is to be established on a pixel which was previously charged to the maximum pixel voltage of the opposite polarity, the maximum slew-rate is decreased by a factor of four.

SUMMARY OF THE INVENTION

According to a first aspect of the invention, there is provided a digital-to-analog converter comprising: a first converter stage for performing first digital-to-analog conversion of the m most significant bits of a k bit input signal;

a precharging circuit for precharging an output load to a precharge voltage in accordance with the result of the first conversion: and a second converter stage for performing a second digital-to-analog conversion of the n least significant bits of the k bit input signal.

The sum of m and n may be equal to k.

The first stage may be arranged to select first and second voltages of a plurality of reference voltages in accordance with the m most significant bits.

The plurality of reference voltages may comprise $2^m+1$ reference voltages.

The first and second voltages may have consecutive values.

The magnitude of the first voltage may be greater than the magnitude of the second voltage and the magnitude of the precharge voltage may be less than or substantially equal to the magnitude of the first voltage and greater than or substantially equal to the magnitude of the second voltage.

The magnitude of the precharge voltage may be substantially equal to the arithmetic mean of the magnitudes of the first and second voltages.

The precharge voltage may be substantially equal to one of the first and second voltages. The precharge voltage may be substantially equal to the second voltage. The first stage may have first and second outputs for the first and second voltages, respectively, and the precharging circuit may comprise a first switch for connecting an output of the converter to one of the first and second outputs during a precharge phase.

The precharging circuit may comprise a second switch for disconnecting an output of the second stage from the output of the converter during the precharge phase.

An output buffer may be connected between the output of the second stage and the second switch. The output buffer may have differential inputs, a first of which is connected to the output of the second stage and a second of which is connected to one of the first and second outputs.

The first stage may comprise an m-to-$2^m$ decoder and first and second $2^m$-to-1 multiplexers.

The second stage may be arranged to convert the n least significant bits to a voltage between the first and second voltages.

The second stage may be arranged to perform a linear conversion.

The second stage may comprise a potential divider, an n-to-$2^n$ decoder and a $2^n$-to-1 multiplexer.

The second stage may comprise a plurality of capacitors and a plurality of switches for selectively connecting the capacitors to receive the first or second voltage in accordance with the n least significant bits.

According to a second aspect of the invention, there is provided an active matrix liquid crystal display comprising a converter according to the first aspect of the invention.

It is thus possible to provide a DAC having a substantially increased conversion speed. By performing precharging of an output load on the basis of an initial or first conversion process, the second conversion stage is required to provide, at worst, a much smaller voltage change so that the total conversion period may be reduced for a given drive capability. In cases where an output buffer is provided, the maximum slew-rate requirement of the buffer can be substantially reduced. Alternatively, for a given speed requirement, the design of the converter and, when present, the buffer can be substantially simplified. Also, a reduced power consumption can be achieved.

BRIEF DESCRIPTION OF THE DRAWINGS

The invention will be further described, by way of example, with reference to the accompanying drawings, in which.

DESCRIPTION OF THE PREFERRED EMBODIMENTS

Figure 1:
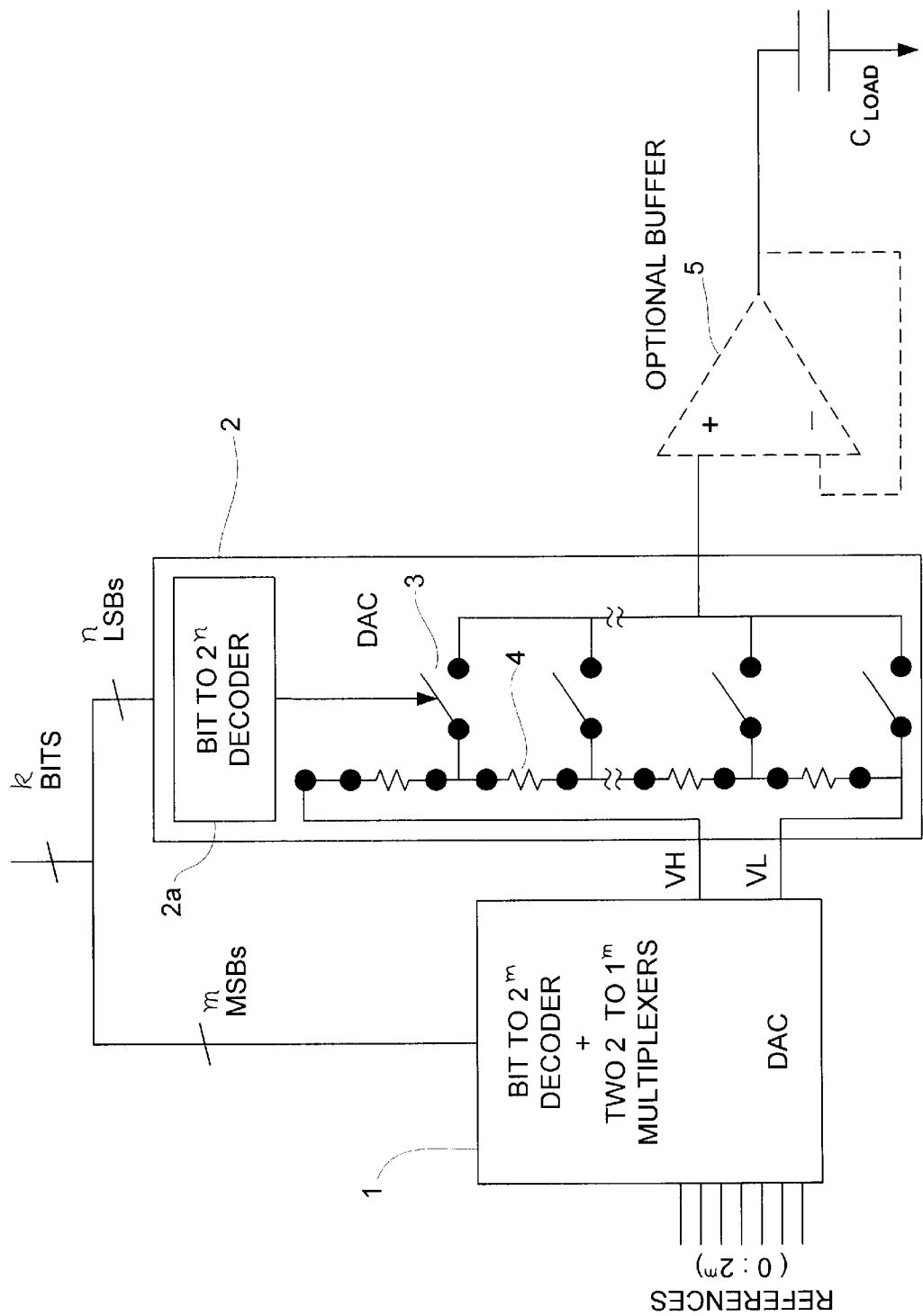
FIG. 1 is a block circuit diagram of a first known type of DAC.

Like reference numerals refer to like parts throughout the drawings.

Figure 2:
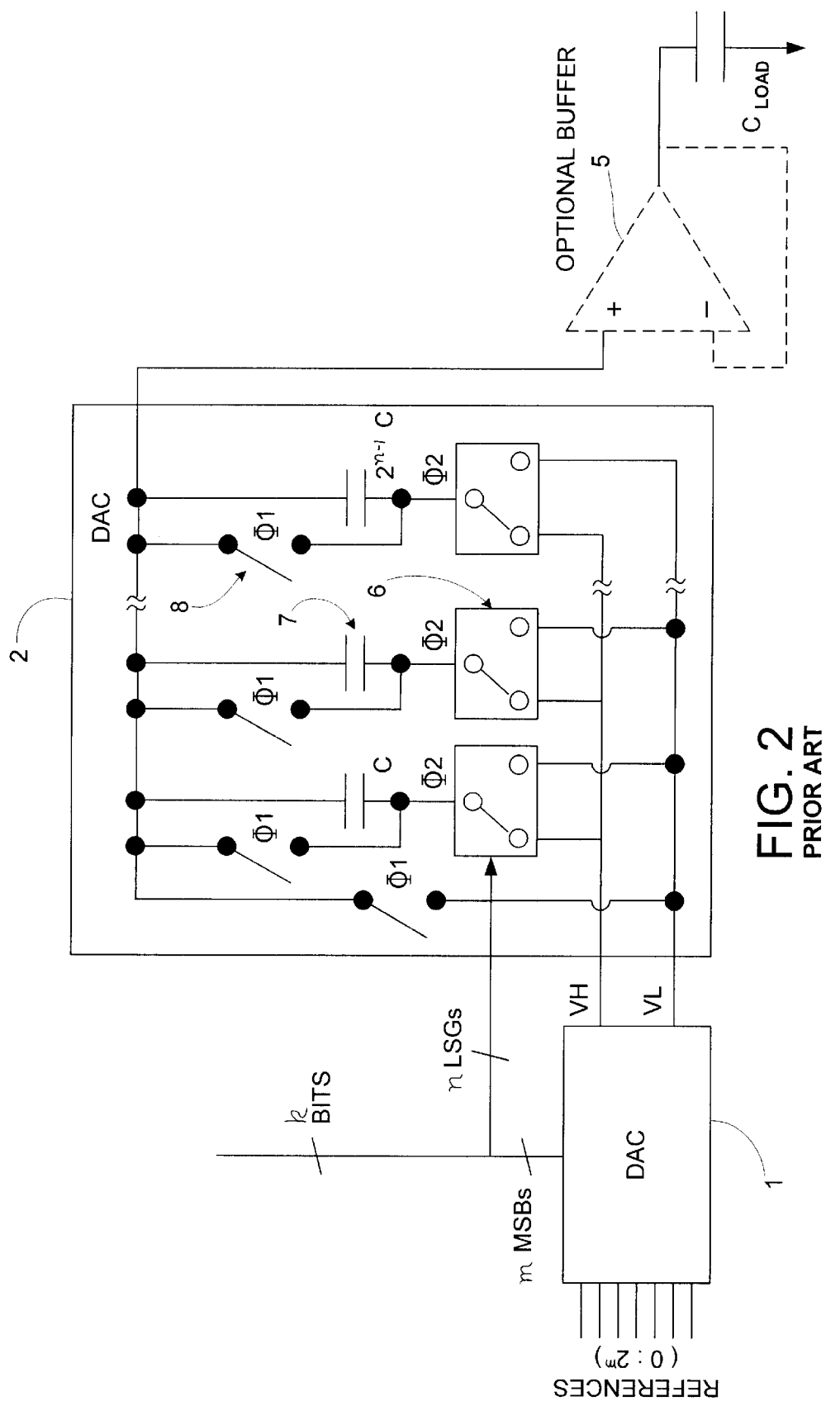
FIG. 2 is a block circuit diagram of a second known type of DAC.
Figure 4:
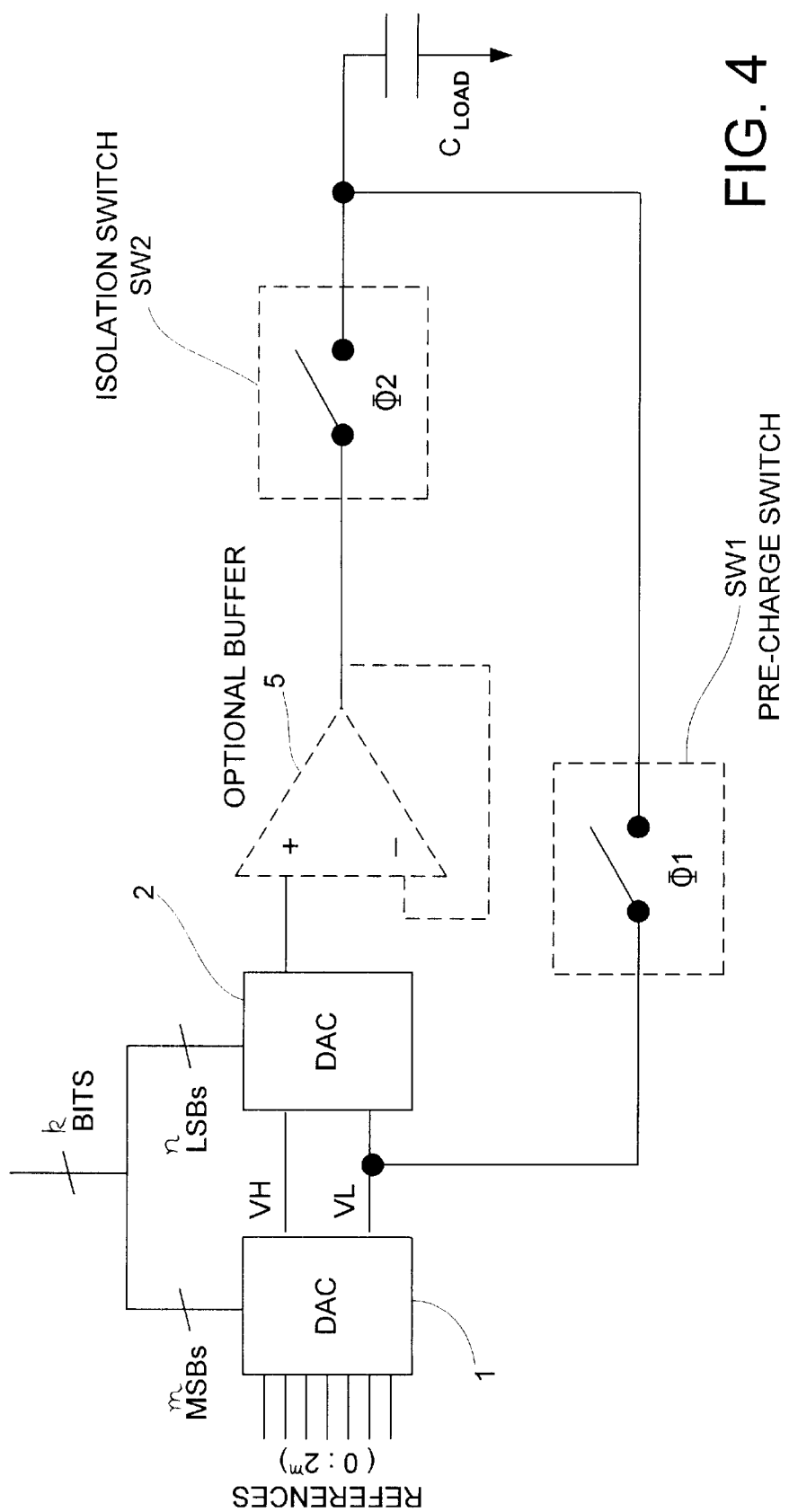
FIG. 4 is a block circuit diagram of a DAC constituting an embodiment of the invention.

The DAC shown in FIG. 4 is of the two stage type comprising a first DAC stage 1 and a second DAC stage 2. The first stage DAC 1 receives the m most significant bits of a k bit parallel input signal whereas the second stage 2 receives the n least significant bits where m+n=k. The first stage 1 is of the same type as illustrated in FIGS. 1 and 2 and described hereinbefore and so will not be described further.

The stage 1 selects the upper and lower voltage limits VH and VL from the reference voltages in accordance with the m most significant bits and supplies these to the second DAC stage 2, which performs a linear conversion of the n least significant bits in the voltage range between VL and VH. The output of the stage 2 is supplied via the optional buffer 5 as described hereinbefore.

The converter of FIG. 4 includes a precharging circuit comprising a pre-charge switch SW1 and an isolation switch SW2. The switch SW1 is connected between the output of the first stage 1 supplying the lower voltage limit VL and the output of the converter connected to the load $C_{LOAD}$. The switch SW2 is connected between the converter output and the output of the stage 2 or the buffer 5 when present. The switches SW1 and SW2 are controlled by non-overlapping two phase clock signals Φ1 and Φ2 such that, during a precharge phase when the clock signal Φ1 is active, the switch SW1 is closed and the switch SW2 is open whereas, during a second clock phase when the clock signal Φ2 is active, the switch SW1 is open and the switch SW2 is closed.

Although the switch SW1 is shown as being connected to the output of the stage 1 providing the lower voltage limit VL, the switch may alternatively be connected to the output supplying the upper voltage limit VH or to a point, such as a tapping point of a potential divider, supplying a voltage between the voltage limits VL and VH. However, for the sake of simplicity, the following description relates to the arrangement illustrated in FIG. 4 with the switch being connected to receive the lower voltage limit VL.

Figures 5, 6, 7:
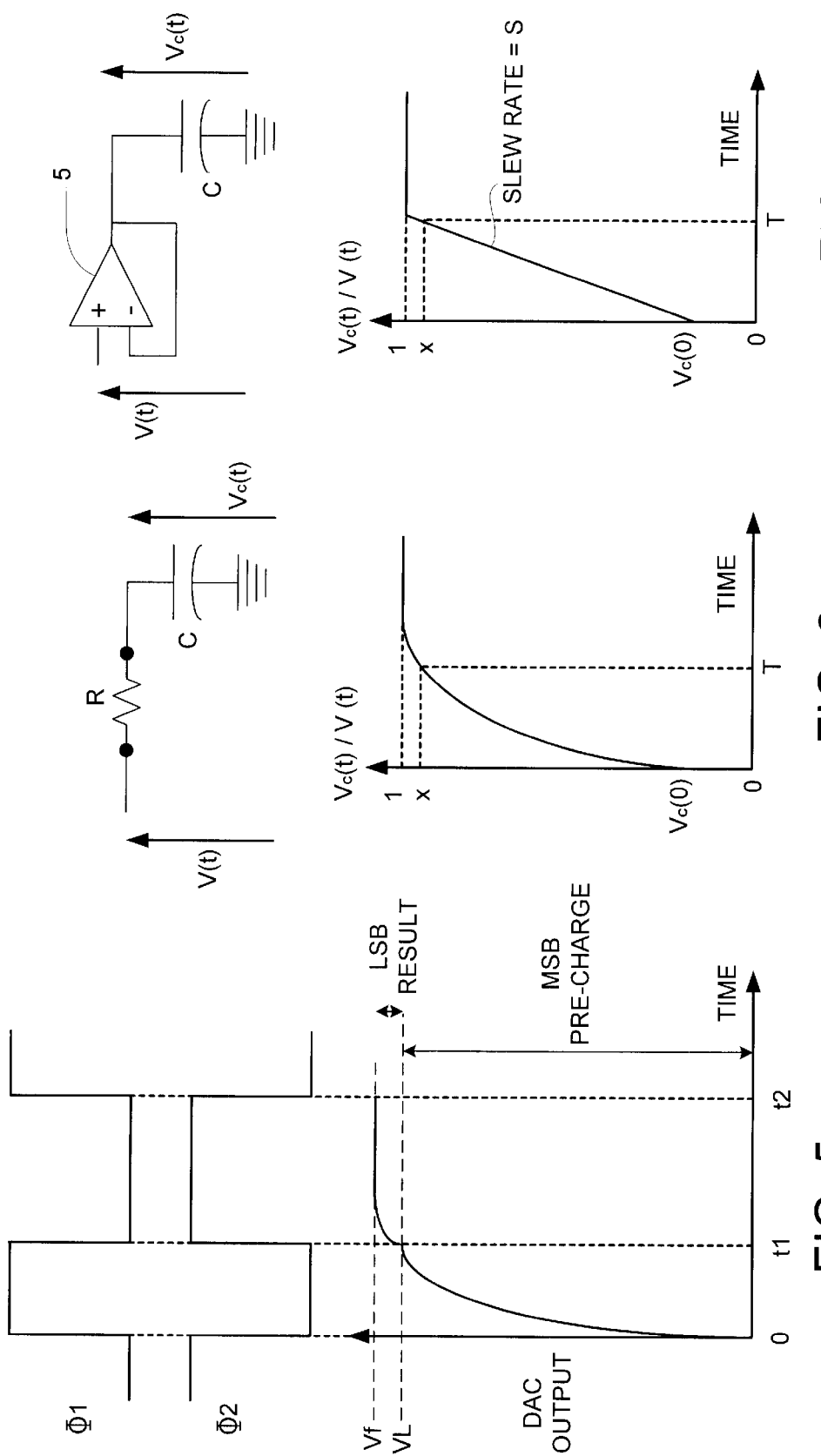
FIG. 5 is a waveform diagram illustrating waveforms occurring in the DAC of FIG. 4.
FIG. 6 is a diagram for illustrating the performance of a DAC when driving a load.
FIG. 7 is a diagram similar to FIG. 6 for illustrating the effect of slew rate limiting for a DAC when driving a load.

FIG. 5 illustrates the clock signals Φ1 and Φ2 and the output voltage of the converter of FIG. 4 against a common time axis. At time zero, the voltage across the load $C_{LOAD}$ could have any value within the working output voltage range of the converter. For example, where the converter is used as part of an AMLCD which supplies pixel signals of opposite polarity is consecutive refresh cycles, the initial voltage could have any value in the working voltage range of the opposite polarity to that which is to be supplied during the current refresh cycle. However, for the sake of simplicity, the initial voltage at time zero is shown as being zero.

At this time, the clock signal Φ1 switches to its active high level whereas the clock signal Φ2 switches to its inactive low level. The switch SW1 is closed and the switch SW2 is opened. The first DAC stage 1 selects two of the input reference voltages in accordance with the m most significant bits of the current k bit input signal to provide voltage limits VL and VH having consecutive values. The switch SW1 connects the load $C_{LOAD}$ to receive the lower voltage limit VL so that the load is charged towards the voltage VL and reaches this value, to within an acceptable precision, before the end of the precharge phase defined by the clock signal Φ1 being active.

The voltage limits VL and VH are supplied to the second DAC stage 2 which performs a linear conversion in the voltage range defined by the voltage limits in accordance with the n least significant bits of the k bit input. The resulting voltage representing the full conversion of the k bit input signal to an analog output signal is supplied from the output of the stage 2, either directly or via the buffer 5 when present, to the switch SW2, which remains open during the first clock phase defining the precharge phase.

At time t1, the clock signal Φ1 switches to its inactive or lower state to end the precharge phase. The clock signal Φ2 becomes active so that the switch SW1 is opened and the switch SW2 is closed. The load $C_{LOAD}$ is disconnected from the low limit voltage VL and is connected to receive the output voltage of the converter. As shown in FIG. 5, charging of the load to the converter output voltage Vf is then completed. The cycle of operations is then repeated at time t2 when the clock signal Φ1 becomes active and the clock signal Φ2 becomes inactive.

FIG. 6. illustrates the output operation of a DAC having a finite output resistance R for charging a load having a capacitance C. The voltage V(t) represents the unloaded output Voltage (the output voltage into an open circuit) at time t whereas $V_o(t)$ represents the voltage across the load at time t. $V_o(0)$ thus represents the initial voltage at time zero across the load.

The voltage across the load is given by:

$$V_e(t) = V_e(0) + [V_e(t) - V_e(0)] \cdot (1 - e^{-t/RC})$$

The conversion is considered to be complete at a time T to an accuracy x defined as:

$$x = \frac{V_c(T)}{V(T)}$$

The time T required for the conversion to be complete is thus given by:

$$T = RC \cdot \ln \frac{(V(T) - V_c(0))}{(1 - x)V(T)}$$

This may be written more simply as:

$$T = RC \cdot \ln \frac{(V - V_0)}{(1 - x)V}$$

by replacing V(T) by V and $V_o(0)$ by $V_0$.

By way of example, a typical AMLCD application requires six bit conversion with m=3 and n=3. In the case of the converter shown in FIG. 4, the precharge voltage $V_0$ is equal to 7V/8 and half least significant bit accuracy for full conversion is reached in:

$$T_{pre} = RC \cdot \ln \frac{\left(V - \frac{7}{8}V\right)}{\left(1 - \frac{63.5}{64}\right)V} = 2.77 \times RC$$

For known types of DAC, for example as shown in FIGS. 1 and 2, the initial voltage $V_o$ in zero and half least significant bit accuracy is reached in:

$$T_2 = RC \cdot \ln \frac{V}{\left(1 - \frac{63.5}{64}\right)V} = 4.85 \times RC$$

Thus, for a given output impedance and load capacitance, the converter of FIG. 4 is almost twice as fast as the known types of converter illustrated in FIGS. 1 and 2. Further, the approximate doubling in speed is a general result for converters in which n=m independently of the number of input bits k. Conversely, for a given conversion speed and using a resistive type of DAC (such as the stage 2 in FIG. 1) for directly driving the load, the power consumption of the stage 2 can be almost halved because larger value resistors may be used to achieve the same conversion speed. In such a case, although the resistive type of DAC has a variable output resistance depending on the actual output voltage, this result is general if, in the above expressions, R represents the variable output resistance.

In the case where the output buffer 5 is present, the finite maximum output slew rate of the buffer 5 may limit the maximum charging rate of the load capacitance C rather than the output resistance or impedance of the buffer 5. The effect of this on the conversion speed of the converter is illustrated in FIG. 7, neglecting the small-signal settling time of the buffer for the sake of simplicity.

In this case, the voltage across the load capacitance C is given by:

$$V_e(t) = V_e(0) + S \cdot t$$

where S is the maximum slew rate of the buffer 5 at its output. By using the same accuracy parameter x as given by:

$$x = \frac{V_c(T)}{V(T)}$$

the conversion time T is given by:

$$T = \frac{1}{S}[xV(T) - V_c(0)]$$

which may be simplified in the same way as hereinbefore to give:

$$T = \frac{1}{S}[xV - V_0]$$

Again, for a full scale conversion with m=3 and n=3 and half least significant bit accuracy, the converter of FIG. 4 completes conversion in:

$$T = \frac{1}{S}\left[\frac{63.5}{64}V - \frac{7}{8}V\right] = 0.12 \times \frac{V}{S}$$

Conversely, a known type of converter for example as shown in FIG. 1 or FIG. 2 has a conversion time given by:

$$T = \frac{1}{S}\frac{63.5}{64}V = 0.99 \times \frac{V}{S}$$

Thus, conversion speed can be increased by a factor of eight. Conversely, for the same conversion speed, the buffer specification and its power consumption can be substantially reduced because the maximum slew rate requirement is almost an order of magnitude lower.

Figure 8:
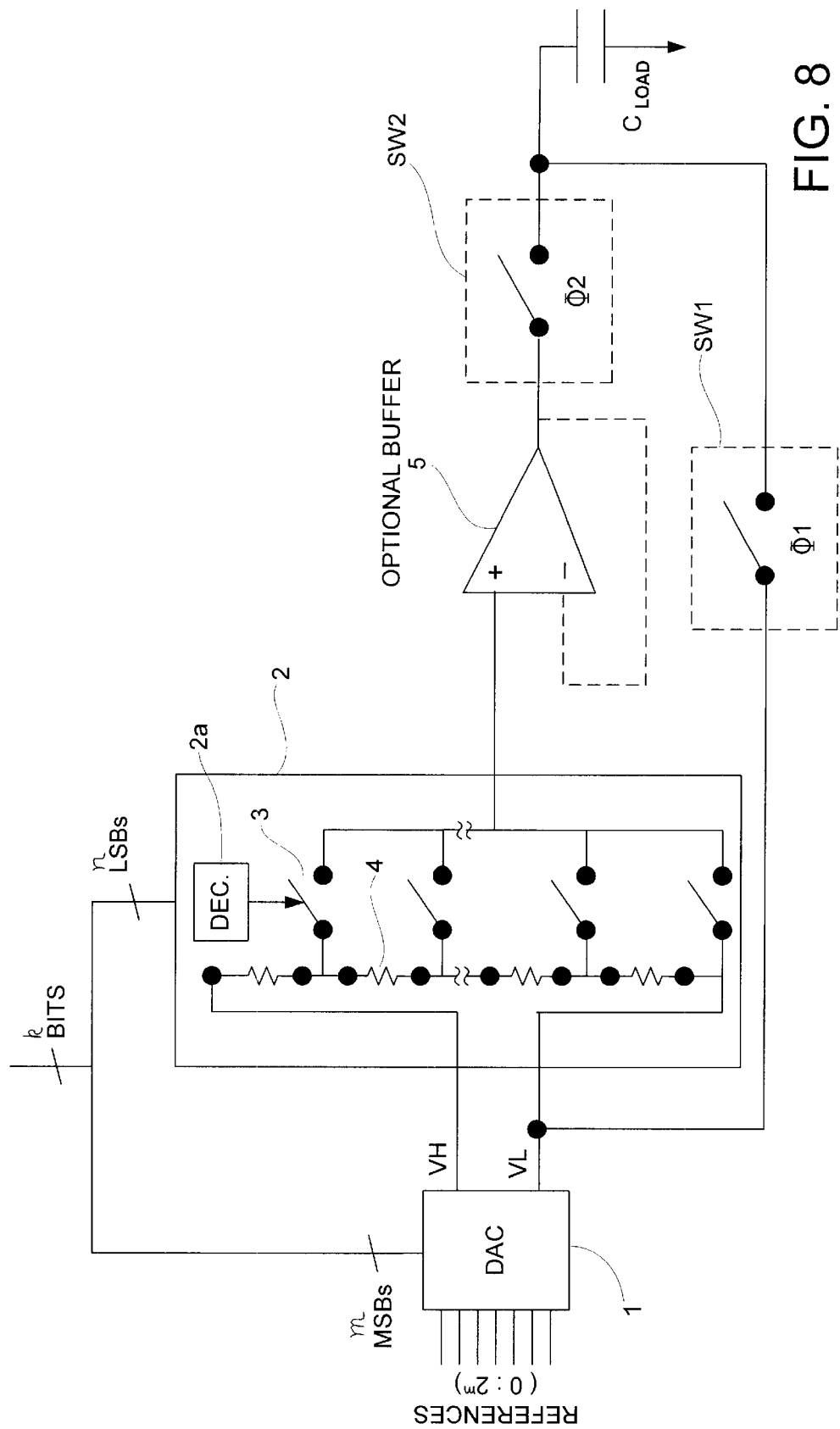
FIG. 8 is a block circuit diagram of a DAC constituting another embodiment of the invention.
Figure 9:
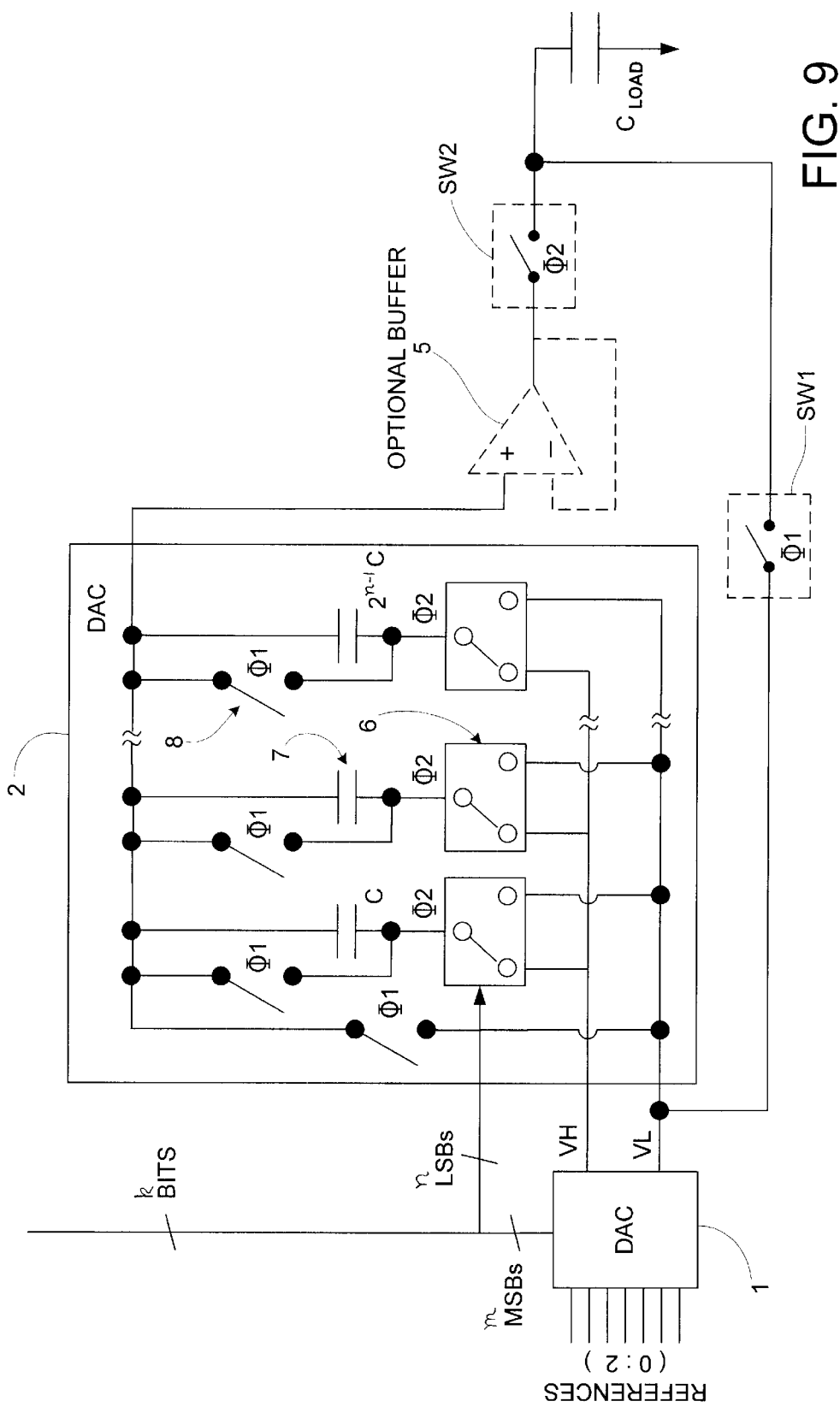
FIG. 9 is a block circuit diagram of a DAC constituting a further embodiment of the invention.
Figure 10:
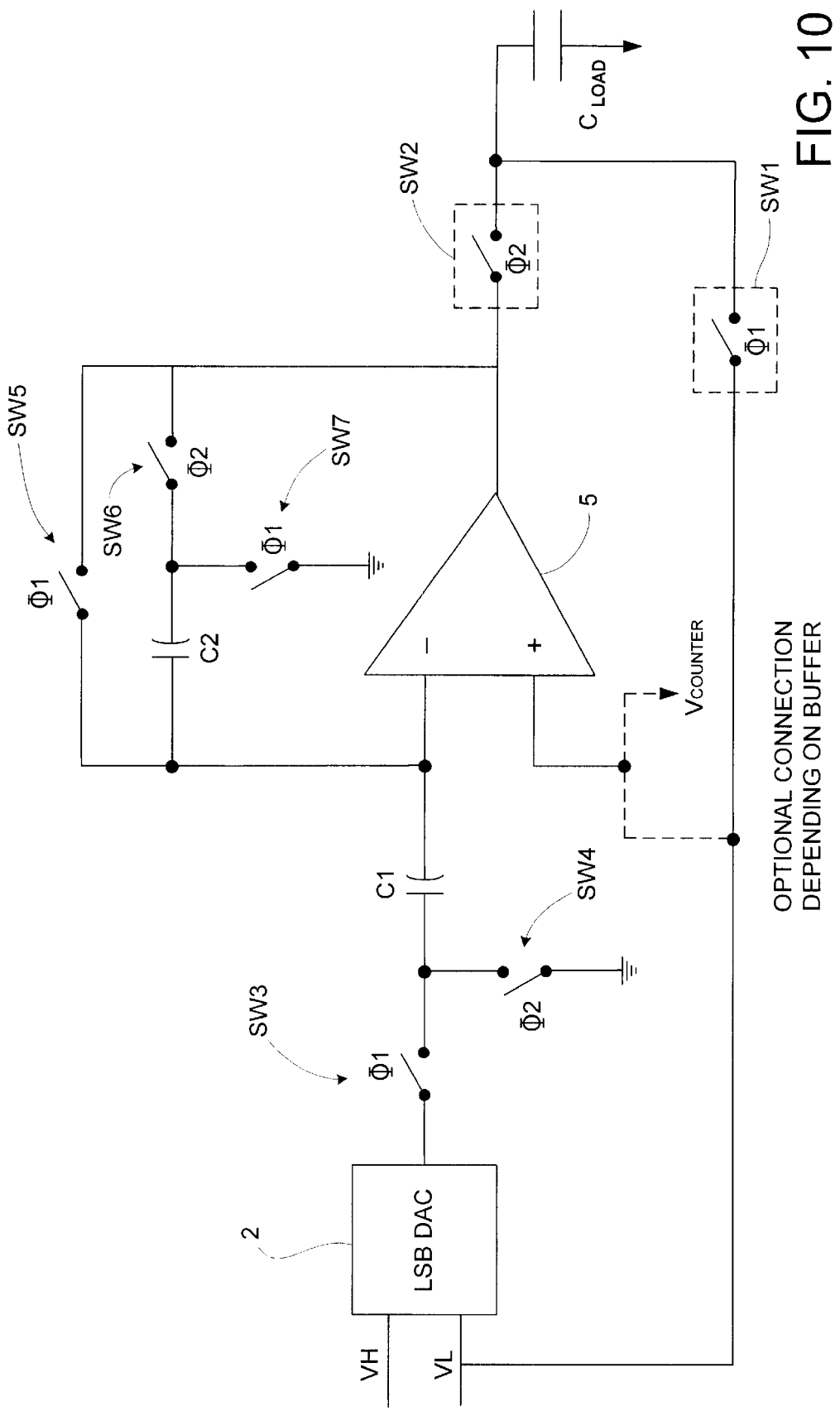
FIG. 10 is a circuit diagram illustrating offset compensation techniques applied to a DAC of the type shown in FIG. 9.

The converter shown in FIG. 8 is of the type shown in FIG. 4 with the second DAC stage 2 being of the resistive ladder type as illustrated in FIG. 1. Similarly, the converter shown in FIG. 9 is of the type shown in FIG. 4 but with the DAC stage 2 being of the binary scaled capacitance type shown in FIG. 2.

Where the converter is required for use in high precision circuitry or is to be embodied by low performance circuitry such as polysilicon thin film transistors, offset compensation circuitry may be required to remove the effects of offsets in the buffer 5 before supplying the output signal to the load. An example of an offset compensation arrangement is shown in FIG. 10 and takes advantage of the two phase operation of the converter to provide offset compensation without prolonging the conversion process. The offset compensation arrangement comprises an input capacitor C1, a feedback capacitor C2 and switches SW3 to SW7. The buffer 5 is of the differential input type which operates as a voltage follower by having one hundred percent negative feedback to its inverting input. The switches SW3, SW5 and SW7 are closed when the clock signal Φ1 is active and open when the clock signal Φ2 is inactive whereas the switches SW4 and SW6 are open when the clock signal Φ1 is inactive and closed when the clock signal Φ2 is active.

The non-inverting input of the buffer 5 may be connected to receive the lower voltage limit VL or to a fixed voltage such as that on the counter electrode of an AMLCD. When the non-inverting input of the buffer 5 receives the lower voltage limit VL, the dynamic operation of the circuit is improved because the offset is measured very close to the desired final result. However, if the common mode input voltage range of the buffer 5 is insufficient, the non-inverting input can be connected to the constant voltage and the input stage of the buffer 5 remains substantially at a constant operating point, which may be advantageous if the buffer 5 is required to operate with input voltages substantially between the upper and lower supply voltages for the buffer 5.

Figure 11:
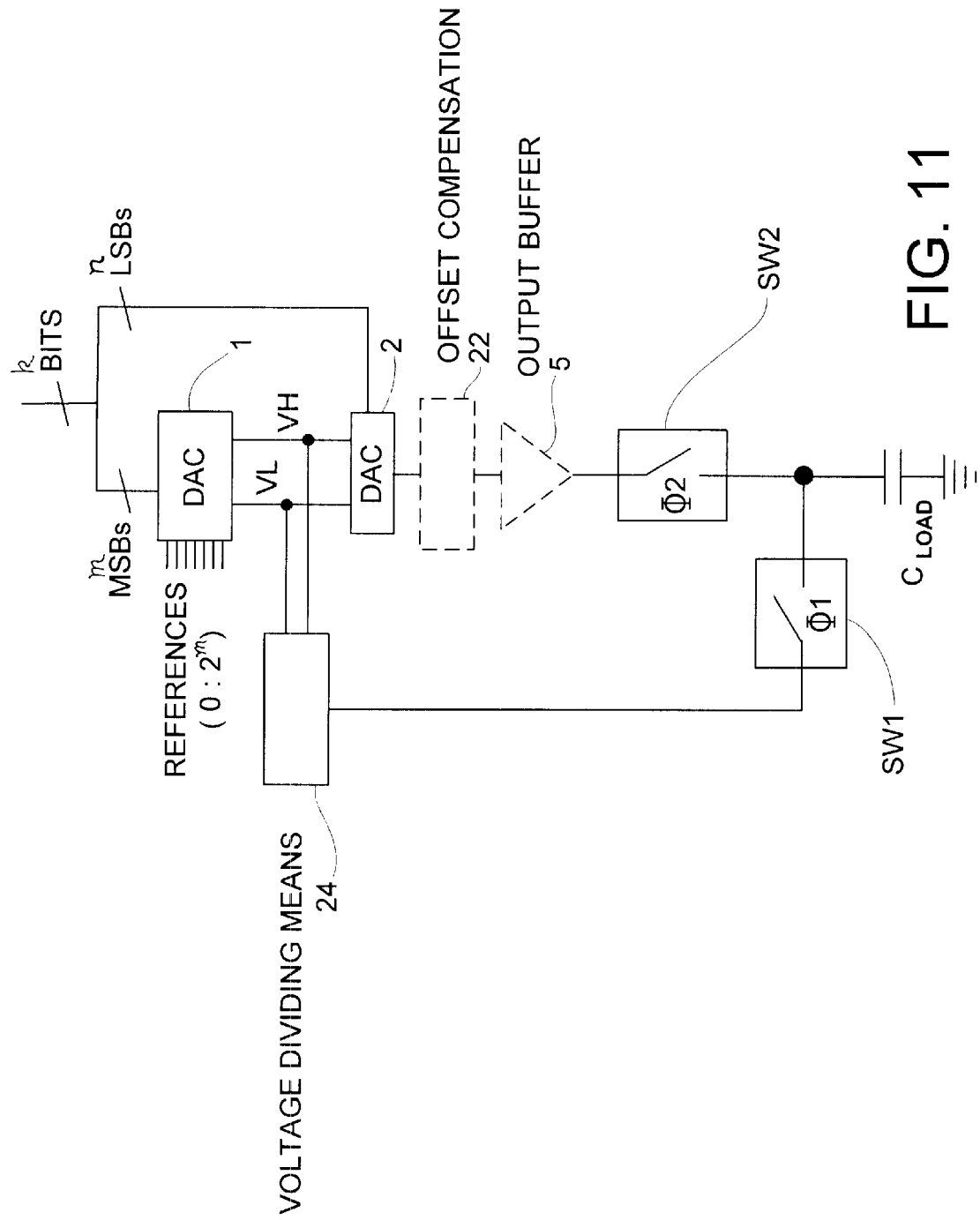
FIG. 11 is a block circuit diagram of a DAC constituting yet another embodiment of the invention.

The converter shown in FIG. 11 is of the type shown in FIG. 4 and, in addition to the optional output buffer 5, an optional offset compensation arrangement 22 is illustrated in broken lines. For example, this may be of the type illustrated in FIG. 10. Also, the switch SW1 is connected to the output of a voltage dividing means 24 whose inputs are connected to receive the upper and lower voltage limits VH and VL. For example, the voltage dividing means 24 may be arranged to supply the arithmetic average or mean (VL+VH)/2 of the upper and lower voltage limits to the switch SW1. Thus, when the clock signal Φ1 is active, the load $C_{LOAD}$ is charged towards a voltage between, and preferably midway between, the voltage limits VL and VH. The maximum voltage change which the DAC stage 2 must produce is then approximately half the maximum change required by the previously described embodiments.

Figure 3:
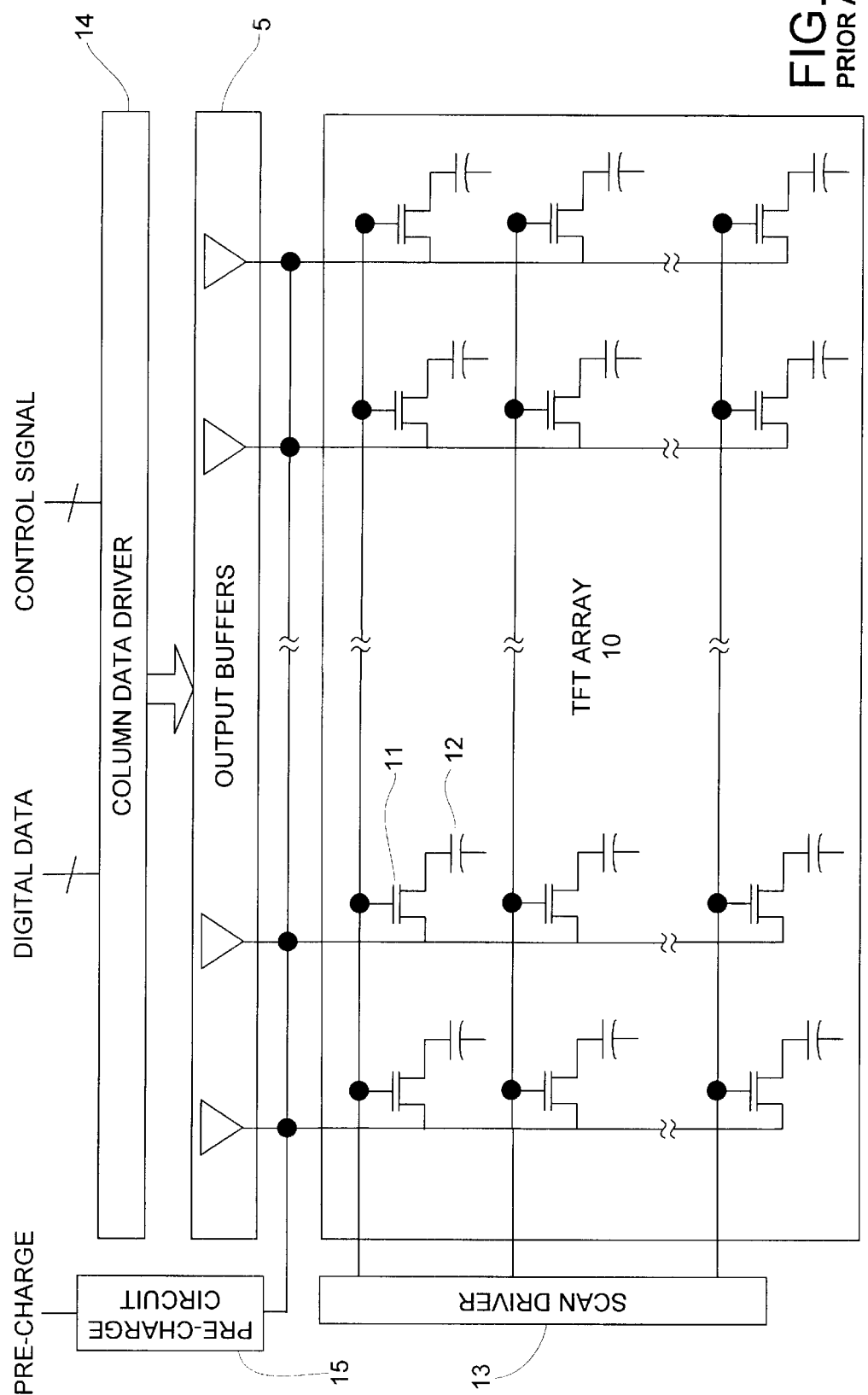
FIG. 3 is a block schematic diagram of an AMLCD including a precharging arrangement of known type.
Figure 12:
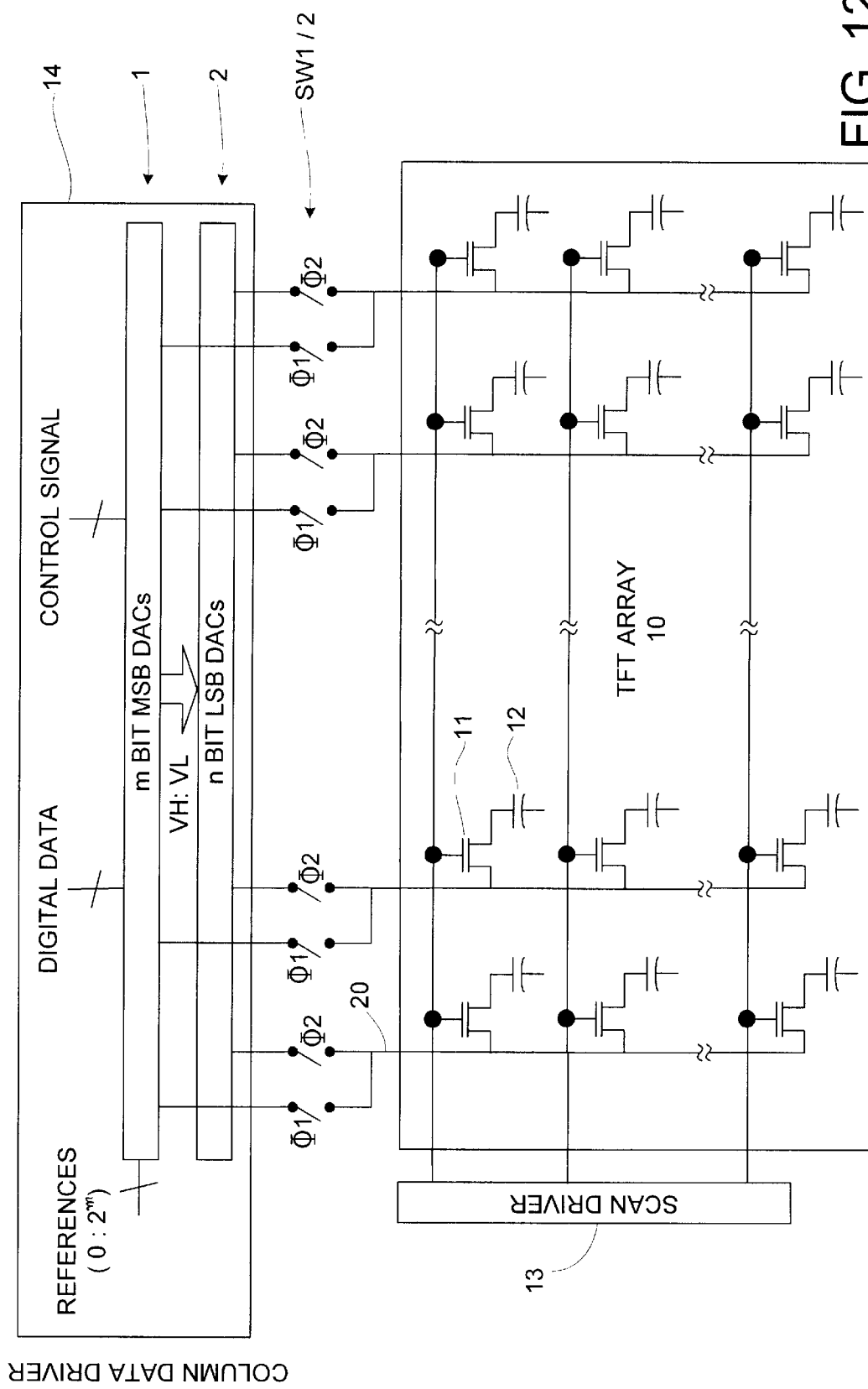
FIG. 12 is a block schematic diagram of an AMLCD constituting an embodiment of the invention and comprising DACs of the type shown in FIG. 4.

FIG. 12 illustrates an AMLCD of a type similar to that shown in FIG. 3 but in which the column data driver 14 comprises a plurality of converters of the type shown in FIG. 4. In particular, each column or data line such as 20 is connected to a respective converter comprising the stages 1 and 2 and the switches SW1 and SW2. Where the drivers 13 and 14 are embodied using relatively low performance polio-silicon transistors, for example using silicon-on-insulator technology, the use of such converters provides improved speed of operation and/or reduced integrated circuit area requirements, which in turn allow the design to be substantially simplified and improved.

What is claimed is:

1. A digital-to-analog converter comprising: a first converter stage for performing a first digital-to-analog conversion of the m most significant bits of a k bit input signal; a precharging circuit for precharging an output load to a precharge voltage in accordance with the result of the first conversion; and a second converter stage for performing a second digital-to-analog conversion of the n least significant bits of the k bit input signal.

2. A converter as claimed in claim 1, in which the first stage is arranged to select first and second voltages of a plurality of reference voltages in accordance with the m most significant bits.

3. A converter as claimed in claim 2, in which the magnitude of the first voltage is greater than the magnitude of the second voltage and the magnitude of the precharge voltage is less than or substantially equal to the magnitude of the first voltage and greater than or substantially equal to the magnitude of the second voltage.

4. A converter as claimed in claim 3, in which the precharge voltage is substantially equal to one of the first and second voltages.

5. A converter as claimed in claim 4, in which the first stage has first and second outputs for the first and second voltages, respectively, and the precharging circuit comprises a first switch for connecting an output of the converter to one of the first and second outputs during a precharge phase.

6. A converter as claimed in claim 5, in which the precharging circuit comprises a second switch for disconnecting an output of the second stage from the output of the converter during the precharge phase.

7. A converter as claimed in claim 6, comprising an output buffer connected between the output of the second stage and the second switch.

8. A converter as claimed in claim 7, in which the output buffer has differential inputs, a first of which is connected to the output of the second stage and a second of which is connected to one of the first and second outputs.

9. A converter as claimed in claim 3, in which the magnitude of precharge voltage is substantially equal to the arithmetic mean of the magnitudes of the first and second voltages.

10. A converter as claimed in claim 3, in which the first stage comprises an m-to-$2^m$ decoder and first and second $2^m$-to-1 multiplexers.

11. A converter as claimed in claim 2, in which the plurality of reference voltages comprise $2^m+1$ reference voltages.

12. A converter as claimed in claim 11, in which the first stage comprises an m-to-$2^m$ decoder and first and second $2^m$-to-1 multiplexers.

13. A converter as claimed in claim 2, in which the first and second voltages have consecutive values.

14. A converter as claimed in claim 13, in which the first stage comprises an m-to-$2^m$ decoder and first and second $2^m$-to-1 multiplexers.

15. A converter as claimed in claim 2, in which the second stage is arranged to convert the n least significant bits to a voltage between the first and second voltages.

16. A converter as claimed in claim 15, in which the second stage is arranged to perform a linear conversion.

17. A converter as claimed in claim 15, in which the second stage comprises a potential divider, an n-to-$2^n$ decoder and a $2^n$-to-1 multiplexer.

18. A converter as claimed in claim 15, in which the second stage comprises a plurality of capacitors and a plurality of switches for selectively connecting the capacitors to receive the first or second voltage in accordance with the n least significant bits.

19. A converter as claimed in claim 1, in which m+n=k.

20. An active matrix liquid crystal display comprising a converter as claimed in claim 1.

* * * * *